United States Patent [19]
Beilin et al.

[11] Patent Number: 5,916,453
[45] Date of Patent: Jun. 29, 1999

[54] METHODS OF PLANARIZING STRUCTURES ON WAFERS AND SUBSTRATES BY POLISHING

[75] Inventors: Solomon I. Beilin, San Carlos; Michael G. Lee, San Jose; William T. Chou, Cupertino; Larry Louis Moresco, San Carlos; Wen-chou Vincent Wang, Cupertino, all of Calif.

[73] Assignee: Fujitsu Limited, Japan

[21] Appl. No.: 08/717,266

[22] Filed: Sep. 20, 1996

[51] Int. Cl.⁶ ..................... C25F 3/16
[52] U.S. Cl. ............... 216/38; 216/39; 216/57; 216/88; 216/89; 438/634; 438/692; 438/693; 438/697; 438/740; 438/699
[58] Field of Search ............... 438/693, 699, 438/740, 697, 634, 692; 216/88, 89, 38, 39, 57

[56] References Cited

U.S. PATENT DOCUMENTS

| | | | |
|---|---|---|---|
| 4,181,755 | 1/1980 | Liu et al. | 430/314 |
| 4,307,179 | 12/1981 | Chang et al. | 430/314 |
| 4,622,058 | 11/1986 | Leary-Renick et al. | 65/105 |
| 4,634,496 | 1/1987 | Mase et al. | 438/699 |
| 4,795,722 | 1/1989 | Welch et al. | 438/621 |
| 4,824,521 | 4/1989 | Kulkarni et al. | 438/699 |
| 4,954,142 | 9/1990 | Carr et al. | 51/309 |
| 4,981,553 | 1/1991 | Tytgat et al. | |
| 5,006,485 | 4/1991 | Villalon | 438/637 |
| 5,084,071 | 1/1992 | Nenadic et al. | 51/309 |
| 5,091,339 | 2/1992 | Carey | 216/18 |
| 5,098,517 | 3/1992 | Tytgat et al. | 216/106 |
| 5,118,385 | 6/1992 | Kumar et al. | 216/18 |
| 5,137,597 | 8/1992 | Curry, II et al. | |
| 5,162,260 | 11/1992 | Leibovitz et al. | |
| 5,169,491 | 12/1992 | Doan | 438/693 |
| 5,217,586 | 6/1993 | Datta et al. | 204/129.6 |
| 5,219,793 | 6/1993 | Cooper et al. | 438/624 |
| 5,225,034 | 7/1993 | Yu et al. | 438/693 |
| 5,244,534 | 9/1993 | Yu et al. | 438/672 |
| 5,246,884 | 9/1993 | Jaso et al. | 438/693 |
| 5,258,096 | 11/1993 | Sandhu et al. | 438/621 |
| 5,272,117 | 12/1993 | Roth et al. | 216/38 |
| 5,284,548 | 2/1994 | Carey et al. | 216/18 |
| 5,287,619 | 2/1994 | Smith et al. | 29/852 |
| 5,298,463 | 3/1994 | Sandhu et al. | 438/620 |
| 5,302,551 | 4/1994 | Iranmanesh et al. | 438/633 |
| 5,314,843 | 5/1994 | Yu et al. | 438/692 |

(List continued on next page.)

OTHER PUBLICATIONS

T. A. Shankoff, et al., "High Resolution Tungsten Patterning Using Buffered, Mildly Basic Etching Solutions," *J. Electrochem. Soc.: Solid-State Science and Technology*, Feb., 1975, pp. 297–298.

*Materials Handbook for Hybrid Microelectronics*, Teledyne Microelectronics, Los Angeles, CA, 1988, p. 476.

*Goodfellow Metals and Materials for Research and Industry*, Catalog, 1992–1993, pp. 75, 433, 388, 230.

*Handbook of Plastics, Elastomers, and Composites*, Second Edition, Technology Seminars, Inc., Lutherville, Maryland, 1992, pp. C.33 & C.34.

Second Edition, *CRC Materials Science and Engineering Handbook*, CRC Press, 1994, p. 473.

Semiconductor International, "CMP: Suppliers Integrating, Applications Spreading," Nov. 1995, pp. 74–76, 78, 80, 82.

*Primary Examiner*—Janis L. Dote
*Attorney, Agent, or Firm*—Coudert Brothers

[57] ABSTRACT

Methods of planarizing structures formed on the surfaces of substrates and wafers are disclosed. The methods form a planarizing layer over the surface and the structures, or the locations where the structures are to be formed, such that the top surface of the layer has low areas between the locations of the structures, and such that the low areas lie substantially within a plane which is below the tops of the structures. A polish-stop layer is then formed over the low areas of the planarizing layer, the polish-stop layer being more resistant to polishing than the planarizing layer and, preferably, the structures. The resulting surface is then polished. The polishing may be accomplished by, for example, standard mechanical polishing, and chemical-mechanical polishing.

22 Claims, 7 Drawing Sheets

U.S. PATENT DOCUMENTS

| | | | |
|---|---|---|---|
| 5,328,553 | 7/1994 | Poon | 438/633 |
| 5,332,467 | 7/1994 | Sune et al. | 438/633 |
| 5,350,712 | 9/1994 | Shibata | 438/629 |
| 5,354,490 | 10/1994 | Yu et al. | 252/79.1 |
| 5,354,712 | 10/1994 | Ho et al. | 438/643 |
| 5,356,513 | 10/1994 | Burke et al. | 438/699 |
| 5,363,550 | 11/1994 | Aitken et al. | 29/828 |
| 5,380,546 | 1/1995 | Krishnan et al. | 427/126.1 |
| 5,389,194 | 2/1995 | Rostoker et al. | 134/1.3 |
| 5,397,741 | 3/1995 | O'Connor et al. | 438/672 |
| 5,429,987 | 7/1995 | Allen | 438/654 |
| 5,451,543 | 9/1995 | Woo et al. | 438/637 |
| 5,451,551 | 9/1995 | Krishnan et al. | 438/626 |
| 5,453,402 | 9/1995 | Cheung et al. | 438/637 |
| 5,491,113 | 2/1996 | Murota | 216/38 |

METHODS OF PLANARIZING STRUCTURES ON WAFERS AND SUBSTRATES BY POLISHING

FIELD OF THE INVENTION

The present invention relates to methods of planarizing structures on wafers and substrates which employ a polish-stop layer in a polishing process, such as standard mechanical polishing and chemical-mechanical polishing (CMP). As exemplary applications, the methods may be used to form a plurality of structures having uniform height, and multi-layer interconnect substrates for multi-chip modules.

BACKGROUND OF THE INVENTION

In standard polishing processes, the wafer surface is pressed against a polishing pad which is coated with a slurry containing a fine abrasive, such as silica. The polishing pad is usually flat, and the abrasive is held by the pores of the pad and mechanically scrapes away the high points of the wafer. In chemical-mechanical polishing (CMP), an acid or base is added to the slurry, which preferentially etches one or more of the materials to be removed. In some cases, the acid or base converts the material to be removed to a different form which is more readily removed by the abrasive.

In recent years, chemical-mechanical polishing has received more attention and played a more important role in the fabrication of microelectronic devices, mainly because of its capability of providing good global planarity, as well as good local planarity. If planarization processes are not applied in the device fabrication, the interconnect layers are typically finished with varying degrees of non-planarity. Such topography makes it difficult for the fabrication of the next layer. For example, a photoresist layer formed over a highly non-planar surface will not have a uniform thickness, which will lead to non-uniformity in the patterning of the resist. In the case of stacked patterns, this obstacle becomes even more prominent when such non-planarity is imprinted or amplified into the next layer, and the cumulative non-planarity may become so severe after just a few layers that the photolithography process becomes a limiting factor in the device fabrication. CMP processes, such as oxide and metal polishing, have been employed in the manufacturing of integrated circuit (IC) chips, but not so much in chip packaging.

While standard polishing and chemical-mechanical polishing processes can greatly improve planarity of a wafer, the processes do have particular drawbacks. For example, large areas of the wafer having relatively soft, easily abraded material can be over-etched (so-called "dishing"). Also, it is often difficult to control the endpoint of the processes in order to produce layers having known thicknesses. The present invention is directed to addressing these drawbacks.

SUMMARY OF THE INVENTION

The present invention encompasses methods of planarizing structures formed on the surfaces of substrates and wafers. Broadly stated, the present invention forms a planarizing layer over the surface and the structures, or the locations where the structures are to be formed, such that the layer has low areas between the locations of the structures, and such that the low areas lie substantially within a plane which is below the tops of the structures. A polish-stop layer is then formed over the low areas of the planarizing layer, the polish-stop layer being more resistant to polishing than the planarizing layer and, preferably, the structures. The resulting surface is then polished. The polishing may be accomplished by, for example, standard mechanical polishing or chemical-mechanical polishing.

With the methods according to the present invention, a substantially planar polish-stop layer is achieved with a high polishing contrast between the field area of the polish-stop layer and the structures to be planarized. (The field area is generally the area which is between the structures and which is substantially within the same plane.) Polishing time is thereby minimized, and dishing is consequently minimized. Moreover, the thickness of the planarizing layer in the low areas can be set with a high degree of precision, which enables the methods of the present invention to be used to construct structures of relatively precise and uniform height.

In one embodiment of the present invention, the polish-stop layer is formed having apertures around corresponding structures, rather than being formed uniformly across the substrate. The apertures increase the polishing contrast between tops of the structures and the field area of the polish-stop layer since there is no polish-stop material over the tops of the structures before the structures are polished.

In another embodiment of the present invention, the fabrication of the structures is integrated with the formation of the planarization layer and polish-stop layer. In this embodiment, the planarization layer is first formed before the structures are formed. The polish-stop layer is then formed over the planarization layer, and a second planarizing layer, preferably a photoresist layer, is formed over the polish-stop layer. These three layers collectively comprise a composite layer. To form the structures, apertures are formed through the composite layer, and are filled with material to a point above the level of the polish-stop layer. The second planarizing layer is removed, leaving the tops of the structures extending above the top of the polish-stop layer. The resulting structure, which has a high polishing contrast, is subsequently polished. Since the polish-stop layer is generally thin in comparison to thickness of the second planarizing layer, the polish-stop layer may be pre-patterned with apertures for the structures before the second planarizing layer is formed over the substrate.

The methods according to the present invention may be used to construct multilevel interconnect substrates which have dielectric layers of precise and uniform thicknesses. As is known in the multi-chip module art, such a dielectric layer is positioned between two layers of metal interconnect and has a number of conductive vias running through it which connect metal interconnect lines between the two metal layers. Because of the particular steps of the prior art construction methods, the tops of the vias in prior art multi-chip modules (MCM's) dip below the top of the dielectric layer in which they are formed, thereby creating a non-uniform surface. As the number of these dielectric and metal layers increases in the structure, some of the non-uniformities add constructively to produce a final top layer whose surface is highly non-uniform.

A fabrication method according to the present invention may be used to prevent such non-uniform surfaces. In this method, a relatively thick layer of photoresist material, or the like, is formed over a metal layer, the thickness being greater than that of the dielectric layer that will ultimately be formed. The photoresist layer is exposed and developed to form apertures therein, which are then filled with conductive material to form conductive posts (or other conductive structures). The photoresist is thereafter removed to expose the posts and the starting metal layer. A material, usually a dielectric material, is then coated over the posts and the starting metal layer according to the present invention such that the top surface of the material layer has high areas over the posts, low areas between the posts, and transition areas between the high and low areas, and such that the low areas lie substantially within a plane which is below the tops of the structures. A polish-stop layer is then formed over at least the low areas of the material layer, the polish-stop layer being more resistant to polishing than the material. The resulting surface is then polished to the level of the polish-stop layer, which is thereafter removed. A second metal layer may then be formed over the planarized material layer, and the sequence may be repeated to form one or more additional material layers. This embodiment of the present invention is opposite to convention via formation practices in that the conductive material of the via is formed before the aperture is formed in the material layer (e.g., dielectric layer). This embodiment may also be used to form wire interconnect structures, such as those described in U.S. Pat. No. 5,334,804. In that particular application, the material layer would usually be removed.

Accordingly, it is one object of the present invention to increase the uniformity of polishing processes.

It is another object of the present invention to increase the precision of polishing processes.

These and other objects of the present invention and specific embodiments thereof will become apparent to those skilled in the art from the following detailed description of the invention, the accompanying drawings, and the appended claims.

DETAILED DESCRIPTION OF THE INVENTION

Figure 1:
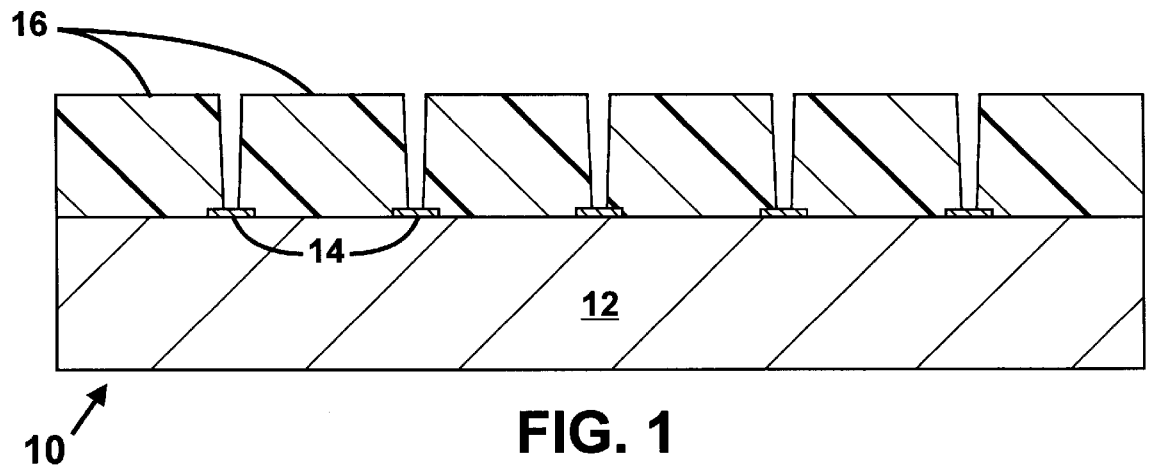
FIGS. 1–6 are cross-sectional views of a substrate having structures thereon which are planarized according to a first general embodiment of the present invention.

FIGS. 1 through 11 illustrate a first general embodiment of the present invention and variations thereof. FIG. 1 shows a cross-sectional view of a substrate 12 which has a plurality of pads or traces 14 where electrical interconnect structures are to be formed and subsequently planarized. A layer 16 of photosensitive material is formed over substrate 12, exposed to actinic radiation, and developed to form a plurality of apertures, each being over a pad/trace 14. Layer 16 may comprise a positive photoresist, such as AZ4620, manufac-tured by the Hoechst Corporation. The thickness of layer 16 is greater than that of a material layer 20 that will be formed later.

Figure 2:
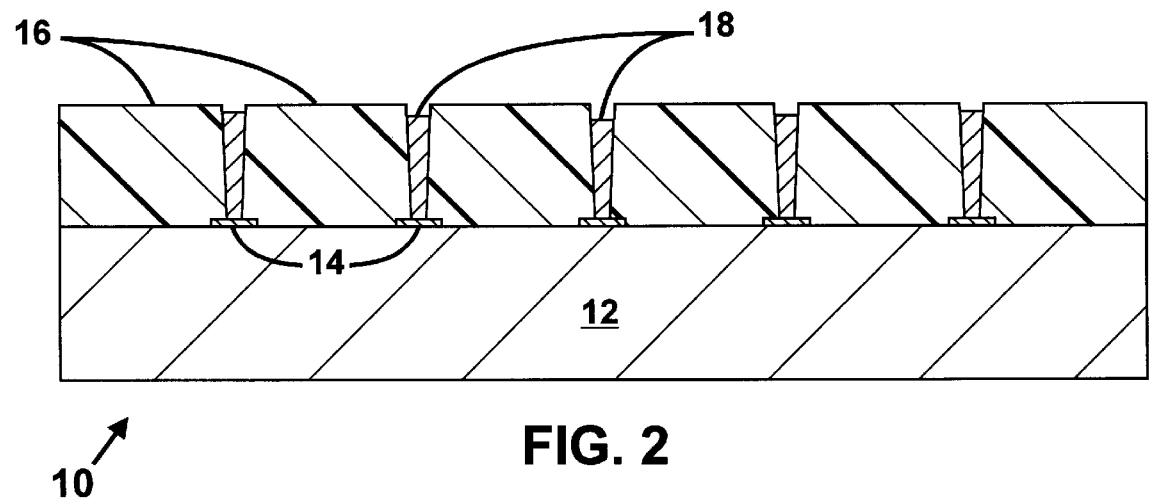

FIG. 2 shows a cross-sectional view of the resulting structure where the apertures have been filled with conductive material, such as by CVD deposition, electroless plating, or electrolytic plating, to form conductive posts 18 within the apertures. If electrolytic plating is employed, a conductive seed layer is formed over the top surface of substrate 12 before photoresist layer 16 is formed. In general, not all deposition processes, including plating processes, can produce uniform heights for the posts 18. In FIG. 2, non-uniform heights are shown, where the center post 18 is shorter than the end posts 18. It may be appreciated that posts 18 may be formed of other materials besides conductive materials in those cases where the invention is being applied to construct articles of manufacture other than those shown herein by the inventors to exemplify the invention.

Figure 3:
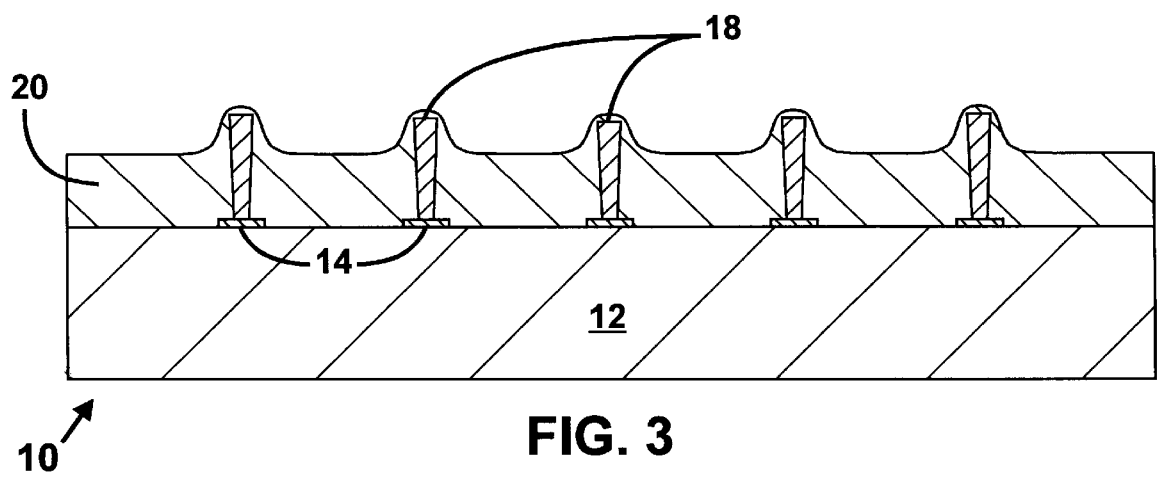

Photoresist layer 16 is then removed (stripped), and any conductive seed layer may be removed with a suitable etchant. The etching of seed layers is well known to the art, as are the suitable etchants for seed layers. Next, a material layer 20 is formed over substrate 12 and posts 18, as shown in FIG. 3. In constructed embodiments of the present invention, layer 20 is formed by spin-coating substrate 12 and posts 18 with a fluidized "spin-on" polyimide, which is then cured. (Curing may be accomplished by heat treatment, electron-beam treatment, UV light treatment, or a combination thereof.) Various chemical vapor deposition (CVD) processes may be used to deposit other materials, such as silicon dioxide and silicon nitride. In either case, planarizing layer 20 is formed such that its top surface has high areas over posts 18, low areas between posts 18, and transition areas between the high and low areas, with the low areas lying substantially within a plane which is below the tops of posts 18. Since the low portions of layer 20 lie substantially within a single plane, layer 20 is referred to as a planarizing layer. Layer 20 is relatively thick, and can be formed with processes that provide for relatively precise and uniform thickness.

Figure 4:
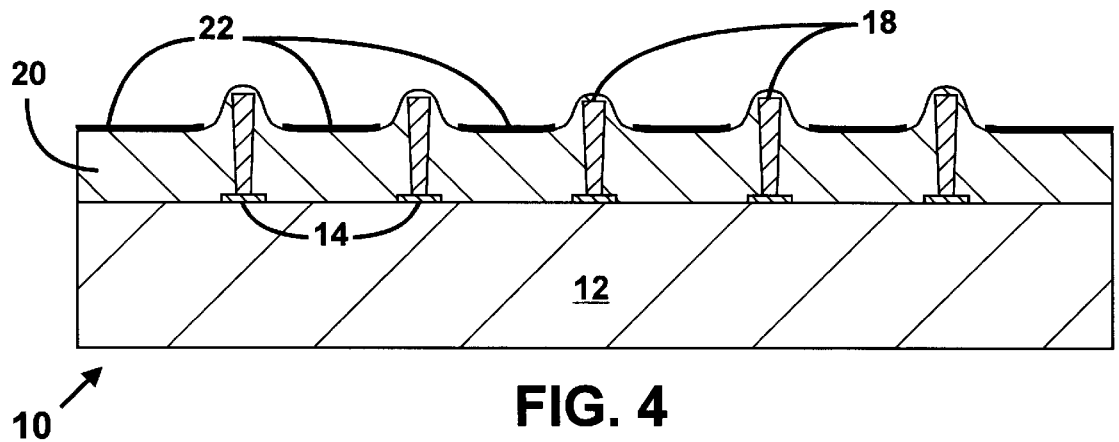

Next, a polish-stop layer 22 is formed over layer 20, as shown in FIG. 4. Polish-stop-layer 22 comprises a material which is more resistant to polishing than layer 20, and preferably more resistant than the material of posts 18. In one preferred embodiment, polish-stop layer 22 is formed substantially over only the low areas of planarization layer 20 to improve the polishing contrast between the portions to be removed and the polish-stop layer, as shown in FIG. 4 in cross-section and in FIG. 10 in a top-plan view. The patterning may be accomplished by a number of ways known in the art, such as subtractive etching, and deposition (such as by sputtering) using a lift-off mask over the high-points.

Figure 10:
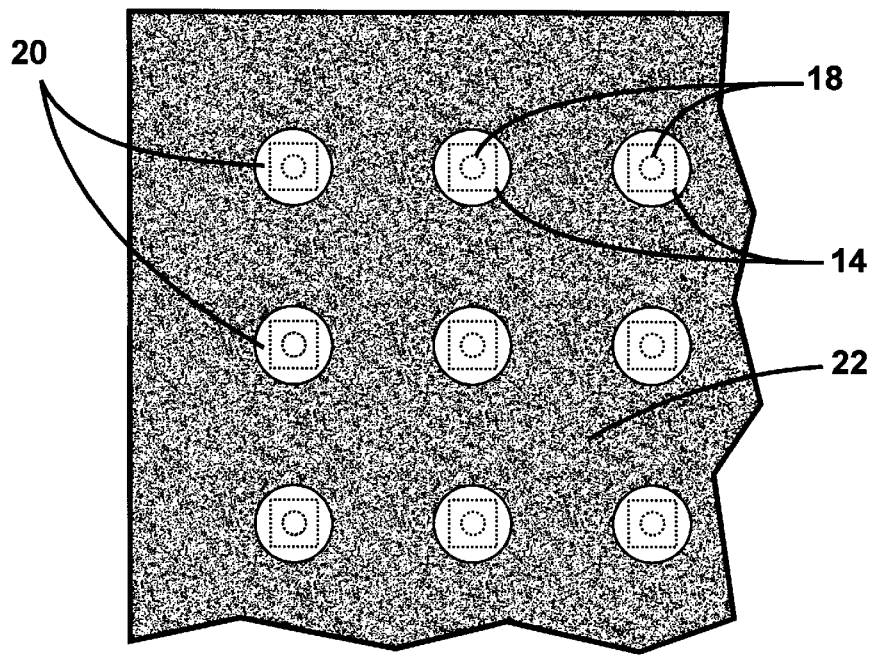
FIG. 10 is a top plan view of the substrate described with reference to the previous Figures, showing the substrate with a polish-stop layer according to the first embodiment (and variation thereof) according to the present invention.
Figure 11:
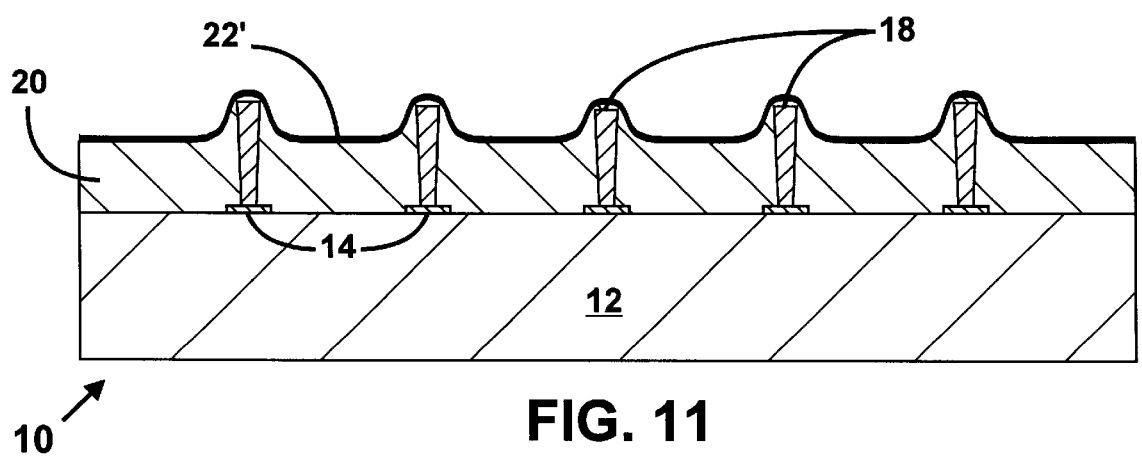
FIG. 11 is a cross-sectional view of a substrate having structures thereon which are planarized according to a second variation of the embodiment of the present invention described with reference to FIGS. 1–6.

In the embodiment shown in FIGS. 4 and 10, layer 22 preferably does not overlay a substantial portion of the transitional area between the high areas and lows areas. (However, those skilled in the art will recognize that misalignment of the processing masks may cause some localized overlaying of the transitional areas.) In another embodiment, the polish-stop layer may be uniformly deposited over planarizing layer 20, as shown at 22' in the cross-sectional view of FIG. 11. During the beginning of the polishing process, the portions of polish-stop layer 22' which is directly over the tops of posts 18 will be removed at a rate higher than the removal rate of the low-lying areas because the protruding portions are subjected to scraping (side polishing), as well as to a much higher pressure than the field area of the polish-stop layer 22'.

Exemplary materials for polish-stop layer 22 include: tungsten, beryllium, molybdenum, rhodium, titanium, chromium, many carbide materials (e.g., tungsten carbide, di-tungsten carbide, zirconium carbide, boron tetracarbide, titanium carbide, vanadium carbide), many nitride materials (e.g., aluminum nitride, titanium nitride), and many oxide materials (e.g., oxides of silicon, aluminum, titanium, zirconium, tantalum). The oxide materials may be formed during the polishing operation by using a polish-stop layer of the element (e.g., Si, Al, Ti, Zr, Ta) and by including an oxidizing agent in the slurry which converts the top of the elemental layer to the element's oxide. For example, phosphoric acid may be included in the slurry to oxidize tungsten to tungsten oxide.

Figure 5:
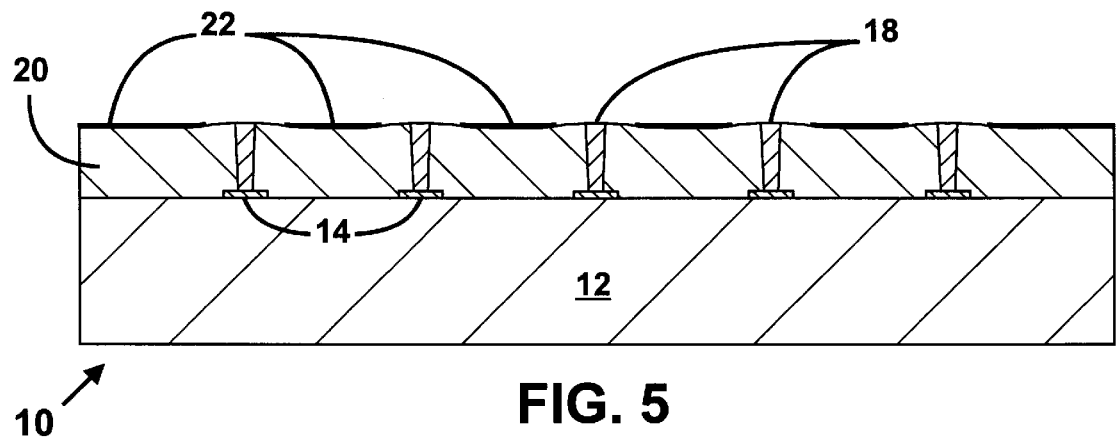
Figure 6:
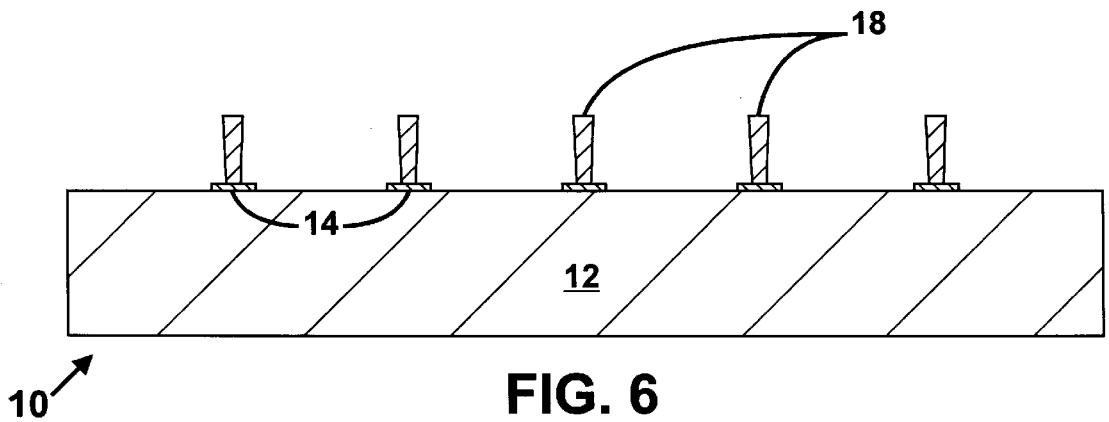
Figure 7:
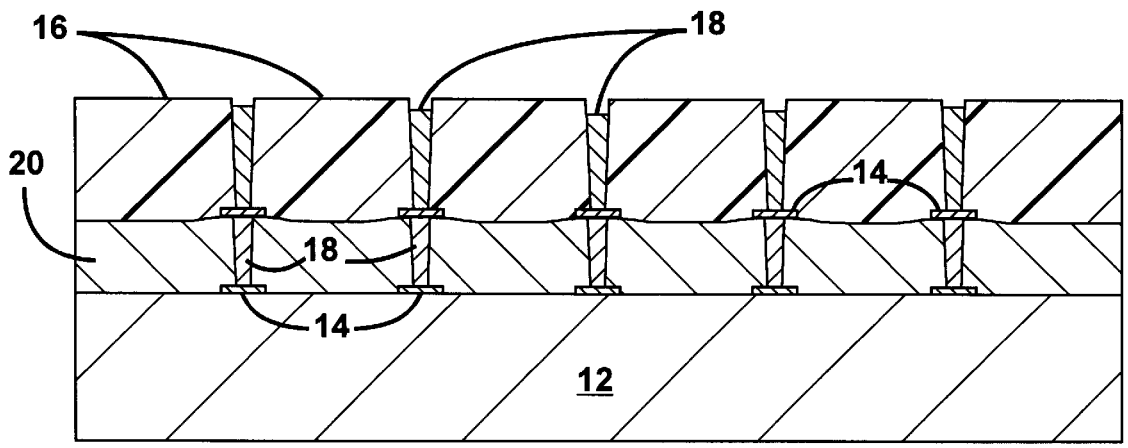
FIGS. 7–9 are cross-sectional views of a substrate having structures thereon which are planarized according to a first variation of the embodiment of the present invention described with reference to FIGS. 1–6.
Figure 8:
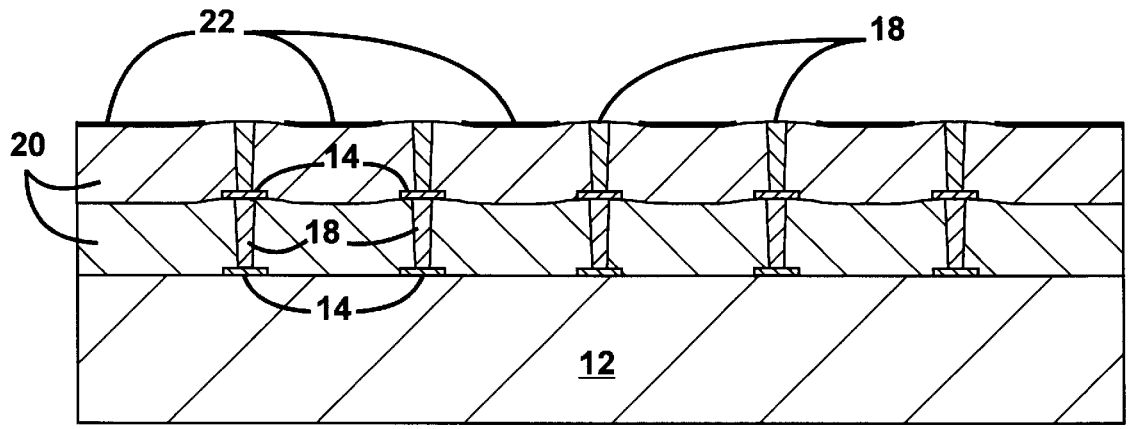
Figure 9:
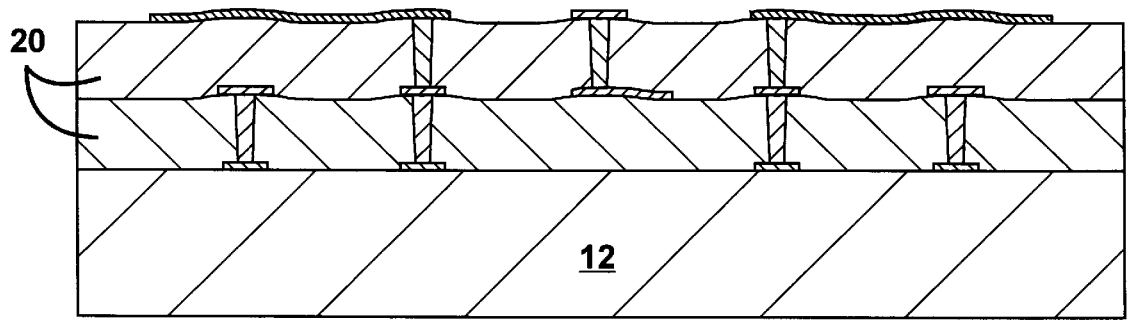

Next, the resulting structure is polished to remove the high areas and transitional areas of planarizing layer 20, and to level the tops of posts 18 to be substantially even with the low areas of layer 20. Conventional polishing (abrasive only) or chemical-mechanical polishing (abrasive plus etchant) may be employed. The resulting structure is shown in FIG. 5. At this point, further processing of the structure may proceed in different directions, which often depends upon the application. As one example, polish-stop layer 22 and planarizing layer 20 are removed, which leaves posts 18 free-standing (FIG. 6). The posts 18 may be used as wire interconnect structures, as described in U.S. Pat. No. 5,334,804. As another direction, polish-stop layer 22 may be removed and the above fabrication steps may be repeated to form a second level of structures over the first, as is shown in FIGS. 7 and 8. Because of the good planarity achieved by the methods of the present invention, non-uniformities are not amplified. A multi-layered interconnect wiring board, as for example shown in FIG. 9, may be constructed with the methods according to the present invention. In this application, layers 20 comprise dielectric materials, traces are formed on the tops of layers 20 to route the signals, and posts 18 serve to interconnect traces between the various metal layers. In the example shown in FIG. 9, signals originating from substrate 12 may be routed in X and Y directions, as needed. Fabricating such structures according to this embodiment of the present invention is opposite to convention via formation practices in that the conductive material of the via is formed before the aperture in the dielectric layer is formed. In this embodiment, dielectric material is formed around the posts, thereby creating the apertures after the posts are formed.

Figure 12:
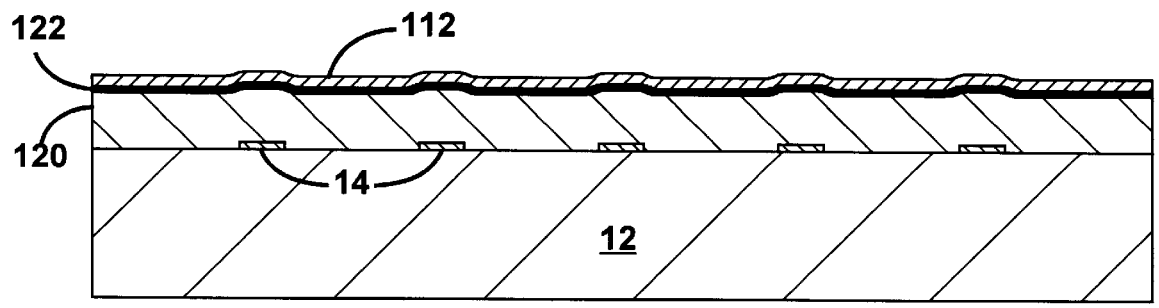
FIGS. 12–17 are cross-sectional views of a substrate having structures thereon which are planarized according to a second general embodiment of the present invention.
Figure 13:
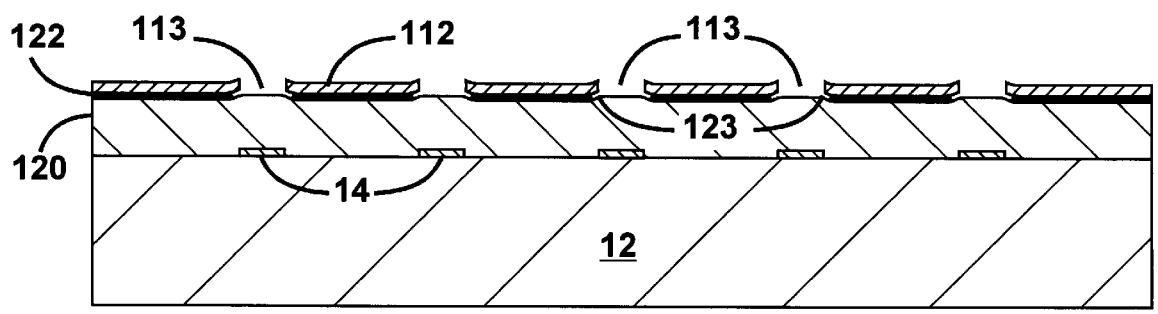

FIGS. 12 through 17 illustrate a second general embodiment of the present invention, and variations thereof, wherein the construction of the planarizing layer and polish-stop layers according to the present invention are integrated within the formation process of the structures to be planarized. FIG. 12 shows a cross-sectional view of a substrate 12 which has a plurality of pads or traces 14 where electrical interconnect structures are to be formed and subsequently planarized. A planarizing layer 120 is formed over substrate 12 and pads/traces 14, and a polish-stop layer 122 is formed over planarizing layer 120. Layer 120 may comprise the same materials as layer 20, and layer 122 may comprise the same materials as layer 22. Layer 120 is substantially planar except for very small protrusions which occur over pads 14. A layer 112 of photosensitive material, such as positive photoresist, is formed over polish-stop layer 122, and will be used in selectively etching portions of polish-stop layer 122. Referring to FIG. 13, layer 112 is pattern exposed to actinic radiation (usually UV light), and developed to form apertures 113 over pads 14 and in the locations where posts 18 will be subsequently formed. The exposed portions of layer 122 are exposed to an etchant, which removes the exposed portions, thereby transferring the pattern previously formed in photosensitive layer 112 and creating corresponding apertures 123 in layer 122. Some over-etching may occur. The same mask used to pattern pads 14 may be used to pattern photosensitive layer 112, thereby saving on processing costs.

Figure 14:
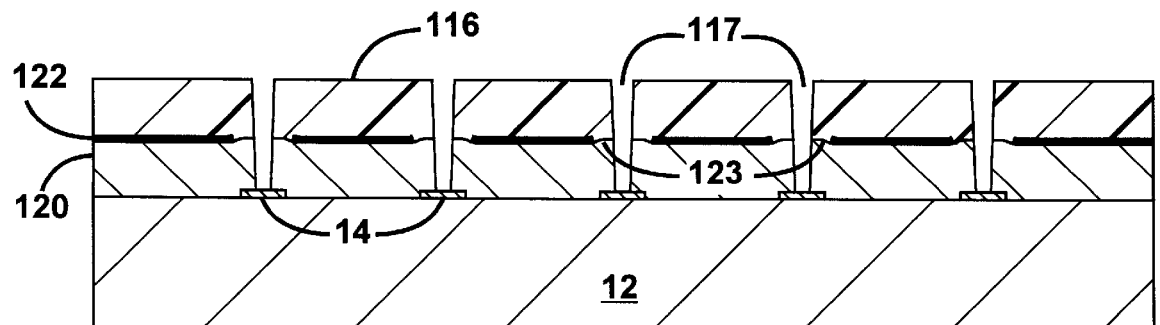

Referring to FIG. 14, photosensitive layer 112 is removed, and a new photosensitive layer 116 is formed over polish-stop layer 122 to form a composite layer comprising planarizing layer 120, polish-stop layer 122, and photosensitive layer 116. A plurality of apertures 117 are then formed through the composite layer. Apertures 117 are most readily formed by first pattern exposing photosensitive layer 116 to actinic radiation (for example UV light), developing layer 116, and then using layer 116 as an etch mask to transfer the pattern of apertures in layer 116 to layer 120 by a suitable etching process. An anisotropic etching process is preferred, such as for example plasma assisted etching processes. Reactive ion etching (RIE) is one preferred etching process. Plasma etching will remove a portion of layer 116, but this is of no detrimental consequence as long as layer 116 is sufficiently thick so that at least approximately 3 $\mu$m to 5 $\mu$m of thickness remains after etching. If desired, a plasma-etch mask (usually a metal) may be formed over the top of layer 116 to prevent the plasma etch from reducing the thickness of layer 116. The plasma-etch mask may be patterned before layer 116 is patterned, and may be used as a portable-conformal mask (PCM) through which layer 116 is pattern exposed. Such exposure techniques are well known in the art.

In the illustrated embodiment, apertures 123 in polish-stop layer 122 have been formed previous to forming apertures 117 in layers 120 and 116. As a modification of this embodiment, it may be appreciated that layer 116 may be used to pattern polish-stop layer 122, rather than using photosensitive layer 112. For instance, with an un-patterned polish-stop layer 122 underneath a patterned layer 116, an etchant, such as one provided by a wet-chemical etch process, may be used to remove the portions of polish-stop layer 122 which are exposed by layer 116. A significant amount of over-etching may be used to achieve a substantial amount of lateral etching of polish-stop layer 122. Wet chemical etchant may be readily selected which will attack polish-stop layer 122 without substantially etching either of layers 120 and 116. Layers 120 and 116 generally comprise polymer organic materials which are etched (stripped) by hydrocarbon-based solvents, whereas polish-stop layer 122 generally comprises inorganic materials and/or carbide materials which are etched by suitable acids or bases. It is easily within the ordinary skill in the art to select etchants (usually acids) which will etch inorganic materials without significantly etching polymer materials.

Figure 15:
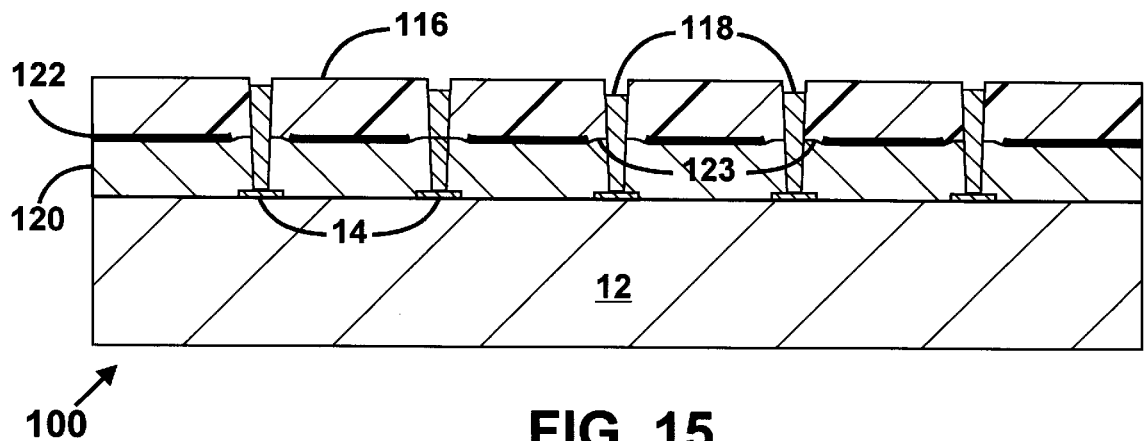
Figure 16:
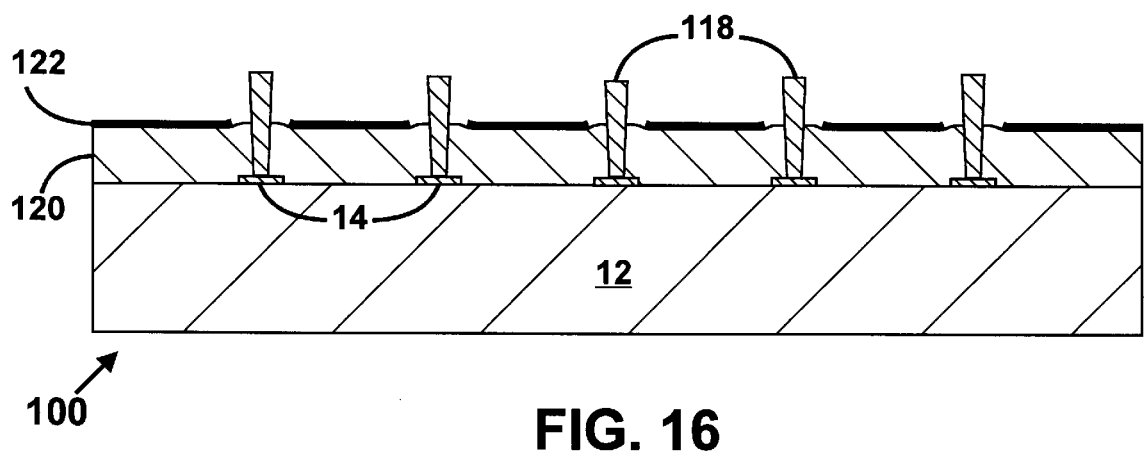
Figure 17:
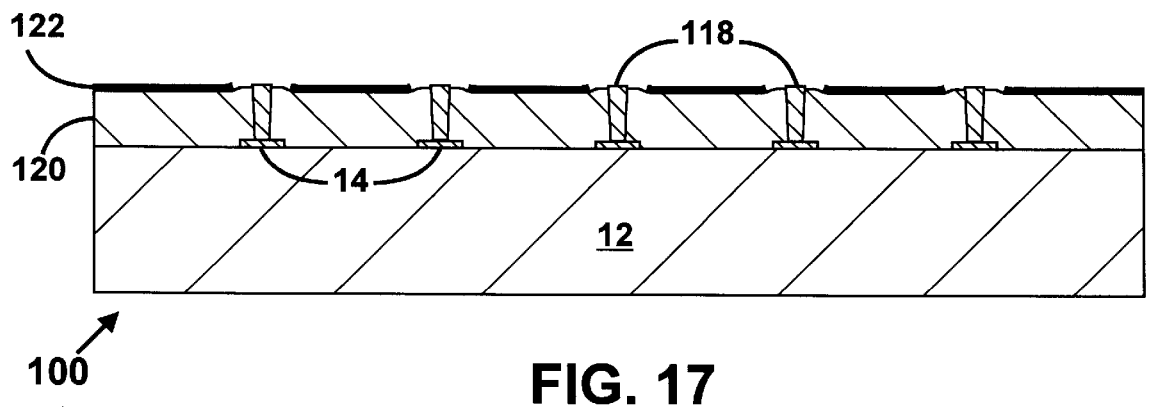

Once apertures 117 are formed, they may be filled with material to form post 118 as shown in FIG. 15 with the deposition processes described above with respect to the first generalized embodiment of the present invention. Thereafter, photosensitive layer 116 is removed, as shown in FIG. 16, and the resulting structure is polished, as shown in FIG. 17. Depending on the application, both layers 120 and 122 may be removed, as in the case of forming wire interconnect structures, or traces may be formed on top of the resulting surface and the process may be repeated to form another planarized layer 120, similar to that previously shown in FIGS. 8 and 9. If polish-stop layer 122 comprises a conductive material, it should be removed if traces are to be formed on top of layer 120, or should at least be patterned to electrically isolate the traces.

If electrolytic plating is used to deposit material within apertures 117, a conductive seed layer may be deposited on the wafer surface before layer 120 is formed. Once posts 118 are formed, the conductive seed layer electrically couples posts 118 to one another. In most applications, this coupling is not desirable. The coupling may be removed by etching away the seed layer after the plating step, which in turn would require removing layer 120 after posts 118 have been formed. It may be appreciated that in some applications, it may be possible to couple the electrical potential for the electrolytic plating process without the need for a seed layer on the top surface of the wafer. For example, in cases where conductive vias have been previously formed through the wafer from the back surface to the sites where posts 118 are to be formed, a conductive seed layer may be deposited at the back surface of the wafer, which would not require the removal of layer 120 in order to electrically decouple the posts.

In constructed examples of this embodiment which are employed to manufacture multi-layer interconnect boards, planarizing layer 120 comprises a polyimide material, which is cured or imidized (i.e., hardened) before photosensitive layer 116 is removed, and preferably before layer 116 is formed. This enables the use of a standard solvent to removed layer 116 without removing layer 120, and the imidization increases the resistance of layer 120 to the solvent. Also, polish-stop layer 122 preferably comprises tungsten, which can be readily removed by a hydrogen peroxide solution which does not damage either of layers 116 and 120, and copper is used as the material which fills apertures 117 to form post 118.

Material Selection Guidelines for Polish-Stop layers 22 and 122

There are three important considerations in selecting the material for polish-stop layers 22 and 122. First, the material needs to have a hardness high enough so that a relatively thin layer of hard mask on the planarizing layer (20/120) is sufficient to arrest polishing and protect the planarizing layer below. Second, the polish-stop material should have good adhesion to the underlying planarizing layer so that no de-lamination occurs during polishing. Last, it is preferable to have an easy way of removing the polish-stop material after polishing is completed. Other factors may also be taken into consideration, such as cost of materials and the amount of wafer bow induced by the deposition of certain polish-stop materials.

Often, no one material can optimally meet all three primary considerations, given the specifics of the application which employs the present invention, such as the particular materials of the structures to be planarized. For the copper/polyimide multi-layer interconnect applications, tungsten metal was found to be best at meeting the three primary considerations among several oxide, nitride, and elemental metal materials tested. In terms of first consideration of hardness, tungsten has an approximate hardness of 400 on the Vickers scale, which is higher than copper's hardness of 90 on the Vickers scale, and polyimide's hardness of E80 on the Rockwell scale. (A Rockwell hardness value of E80 corresponds to a value on the Vickers scale of less than 150.)

Exemplary removal rates of uniformly deposited layers of polyimide, copper and tungsten in conventional alumina and silica slurries are listed in TABLE I in the units of Angstroms per minute (Å/min):

TABLE I

|  | polyimide | copper | tungsten |
|---|---|---|---|
| alumina slurry | 2100 | 2100 | 350 |
| silica slurry | 430 | 90 | 100 |

These slurries generally have a small amount of hydroxide added to give them a mildly basic pH value. Silica has a hardness of 500 on the Vickers scale, which is 20% greater than that of tungsten, and alumina has a hardness of 2,000, which is four times greater than that of tungsten. The hardness of silica and alumina are also greater than those of copper and polyimide, and thus it is expected that the silica and alumina slurries will be able to abrade copper and polyimide. In general, the above removal rates depend upon the process parameters of platen speed, carrier speed, applied pressure, and the slurry flow rate. The above rates were under the conditions of a platen speed of 90 revolutions per minute, a carrier speed of 100 revolutions per minute, an applied pressure of 7 psi (pounds-per-square inch) for round 6-inch (150 mm) diameter substrates, and a slurry rate of 100 cubic-centimeters-per-minute (cc/min) over a platen with a 22-inch (559 mm) diameter. (7 psi is equivalent to 4.83 Newtons/cm2). Although the removal rates are for specific processing conditions, they do provide a general indication of what the relative removal rates for different conditions would be. In other words, the ratios between the above removal rates would be substantially the same over a reasonable range of variation in the process parameters.

In TABLE I, polyimide is polished faster than tungsten in both slurries, which is not surprising given that its hardness is a low E80 in comparison to the much higher 400 for tungsten. However, copper has a mixed result, being polished faster than tungsten in the alumina slurry, but slower than tungsten in the silica slurry. The latter result is somewhat unexpected since the hardness of tungsten is significantly greater than that of copper. The removal rate for polyimide in alumina slurry is about 4.9 times faster than its removal rate in silica slurry, which roughly corresponds to the 4:1 ratio difference in hardness between alumina and silica. Likewise, the removal rate for tungsten in alumina slurry is about 3.5 time faster. However, the removal rate for copper in alumina is about 23.3 times greater than its removal rate in silica.

Compared with silica slurry, alumina slurry polishes tungsten at a fast rate, since it consists of particles of very high hardness. As far as a polish-stop material is concerned, the lower its removal rate is, the more effective the material will be. Slow removal of tungsten certainly reduces the thickness requirement, and consequently the material and process costs in tungsten deposition. As expected, the outermost, fraction of the polish-stop layer will be polished off, and the remaining amount of polish-stop layer generally needs to be removed after polishing, which may, for example, be done by chemical stripping. The thinner the remaining polish-stop layer is, the shorter the chemical stripping time will be. Furthermore, in those cases where the polish-stop layer is removed, a thin thickness improves the final planarity since the removal of the stop material will leave depressions in the surface which have a depth equal to final thickness of the polish-stop layer. As a whole, how thin the tungsten protective layer can be made is decided by how slowly the tungsten layer is polished. Alumina slurry is not suitable when a thin layer of tungsten is used as the polish stop for chemical-mechanical polishing.

The removal rate of tungsten was found to be lower in acidic slurries than in alkaline slurries, and this is believed to be due to the formation of an oxide layer over the tungsten in acidic (low pH) slurries, This oxide layer retards the chemical-mechanical polishing of tungsten. Therefore, it is desirable to polish the samples in acidic slurries so that a thin tungsten layer can hold up longer and serve more effectively as a polish-stop layer. The chemistry of commercial slurries was modified by adding various acids to adjust the pH to be within the acidic range (pH<7.0), and the effects of these acids on polish selectivity were experimentally studied by examining the chemical etching rate of copper, polyimide, and tungsten individually. Copper was etched by nitric acid roughly in proportion to the nitric acid concentration, while neither tungsten or polyimide substantially dissolved in nitric acid. When nitric acid was added to the originally alkaline silica slurry, undesirable dishing in copper was observed as a result of fast chemical etch of copper during polishing. Since acidic slurries are desirable for achieving a slow removal of tungsten, an acid to which copper is inert is preferably added to the slurry. The inventors have discovered that phosphoric acid ($H_3PO_4$) has no significant erosion to copper (Cu), tungsten (W) or polyimide at room temperature. The removal rates using silica slurry blended with nitric acid and phosphoric acid, respectively, are presented below in TABLE II in the units of Angstroms per minute (Å/min):

TABLE II

|  | polyimide | copper | tungsten |
|---|---|---|---|
| silica slurry acidified by nitric acid (3.6% by volume of the modified slurry is concentrated nitric acid solution (77% concentration)) | 520 | 3600 | 35 |
| silica slurry acidified by phosphoric acid (3.5% by volume of the modified slurry is concentrated phosphoric acid solution (85% concentration, 14.8 molar)) | 520 | 90 | 35 |

Figure 18:
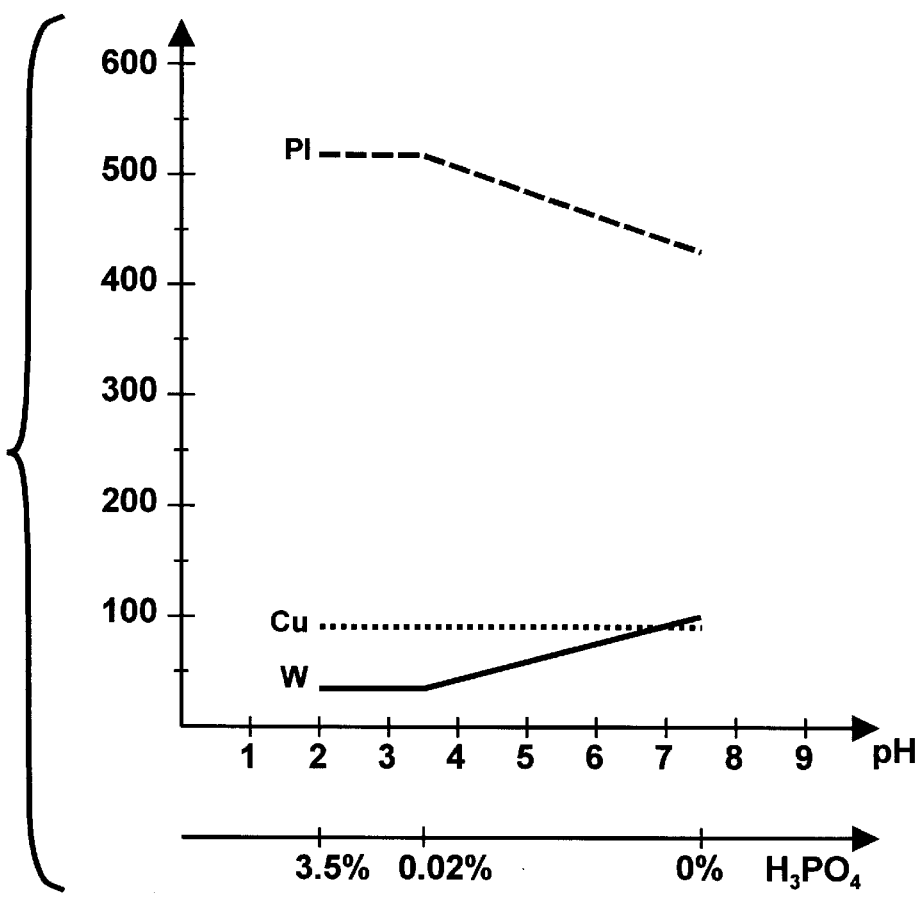
FIG. 18 is a graph showing the removal rate of copper, tungsten and polyimide material in a polishing slurry as a function of pH and concentrate of added phosphoric acid, according to the present invention.

Compared with the polishing results using alkaline silica slurry in TABLE I, the removal rates of copper in the silica slurry acidified by phosphoric acid remained unchanged, while polyimide removal rate increased a little, probably due to slight swelling between the polymer chains. The significant change occurs in the reduction of the tungsten removal rate, and this enables a thin layer of tungsten to be effectively used as the polish-stop layer. FIG. 18 plots the variation in removal rate as a function of the pH level for the copper, polyimide, and tungsten materials in the phosphoric acid based silica slurry. Parallel to the pH axis is a second axis showing the concentration of phosphoric acid (the standard 14.8 molar phosphoric acid solution as a percent by volume of modified slurry); the second axis has specific concentration values of 3.5% and 0.002% notated for pH values of 2 and 3.5, respectively. These concentration values are specific to particular silica slurries used in testing and the correlation between pH and concentration may vary for other slurries. The above pH values were measured experimentally. The changes in removal rates with the concentration of phosphoric acid in slurry can be clearly seen from FIG. 18. The addition of phosphoric acid acidifies the slurry and makes the tungsten layer more resistant to polishing, while not affecting copper and polyimide very much.

Preferably, phosphoric acid is added to reduce the pH of the slurry to at least 6, and more preferably to a value of less than 4. For typical silica slurries, the phosphoric acid typically has a concentration of at least 0.001 percent by weight of the slurry, and preferably at least 0.01 percent by weight of the slurry. For typical slurry solutions, these percentages correspond to having a molarity of at least 0.0011, and preferably of at least 0.011. The inventors have successfully used slurries with a pH range of 2 through 4.

In one example, a 14.8 molar solution of phosphoric acid is added to a silica slurry to produce a modified slurry solution such that the phosphoric acid solution comprises 0.02% by volume of the modified slurry solution. The starting slurry solution comprises approximately 97.5% water, 2.5% fumed amorphous silica, and trace amounts of hydroxide. The modified slurry solution had a pH of approximately 3.5. In another example, a 14.8 molar solution of phosphoric acid is added to the starting silica slurry such that the phosphoric acid solution comprises 3.5% by volume of the modified slurry solution. The modified slurry solution had a pH of approximately 2. The experimental results of the correlation between concentration values and pH levels of these examples are notated in FIG. 18.

The effects of the relative removal rates between copper (Cu), polyimide (PI) and tungsten (W) on planarity were experimentally studied by polishing copper/polyimide interconnects with a tungsten polish-stop layer in silica slurry modified by the inclusion of phosphoric acid. The copper interconnects are usually of much smaller area than the polyimide dielectric, therefore if polyimide is removed faster than copper, the copper posts will be rapidly removed due to side polishing, and the effective removal rate of copper therefore becomes the same as or very close to that of polyimide. On the other hand, if polyimide is more resistant to polishing than copper, whether due to the chemical or mechanical resistance in polishing, polyimide and copper will be polished at about the same rates, but dishing in copper may result. As a whole, the removal rates of polyimide and copper will be about the same for copper/polyimide interconnects, and the slowly removed material will dominate and determine the removal rate of the binary feature. The more important issue is the relative removal rates between tungsten and the slowly removed material, either copper or polyimide. Silica slurry blended with phosphoric acid is a good selection because copper is not chemically etched significantly and the removal rate of tungsten is low compared with that of polyimide, which is the slowly removed material between the interconnects and dielectric.

While the present invention has been particularly described with respect to the illustrated embodiment, it will be appreciated that various alterations, modifications, and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of planarizing a surface of a substrate having two or more structures disposed thereon, said method comprising the steps of:
   (a) forming a first layer of a first material over the surface and the structures such that the top surface of said first layer has high areas over said structures, low areas between said structures, and transition areas between said high and low areas, said low areas being below the tops of said structures;
   (b) forming a second layer of a second material over at least the low areas of said first layer and with an aperture formed over at least one high area of said first layer and around the corresponding structure underlying said high area, said second material having a resistance to polishing which is greater than the resistance of said first material; and (c) thereafter polishing the surface such that portions of said first layer and the structures extending above said second layer are removed.

2. The method of claim 1 wherein the high area underlying said aperture is surrounded by a transition area, and wherein said aperture extends over a portion of said surrounding transition area.

3. The method of claim 1 further comprising the step of removing said second layer.

4. The method of claim 1 wherein the step of polishing comprises the step of chemical-mechanical polishing.

5. The method of claim 4 wherein said second layer comprises a material which oxidizes during chemical-mechanical polishing.

6. A method of forming one or more planarized structures on a surface of a substrate, said method comprising the steps of:

(a) forming a first layer of a first material over the surface of the substrate;

(b) forming a polish-stop layer over said first layer;

(c) forming a second layer over said polish-stop layer, said second layer comprising a photosensitive material;

(d) forming a first set of one or more apertures through the composite layer formed by said first, second, and polish-stop layers, said step including the steps of pattern exposing said second layer to actinic radiation and thereafter developing said second layer;

(e) depositing a third material within said apertures to form one or more structures in said apertures;

(f) removing said second layer with a solvent; and (g) thereafter polishing the resulting exposed surface.

7. The method of claim 6 wherein the step (b) of forming said polish-stop layer comprises forming a second set of apertures in said polish-stop layer wherein at least one aperture of the second set encircles an aperture of the first set.

8. The method of claim 6 wherein a plurality of portions of said polish-stop layer are left exposed after developing said second layer, and wherein said step (d) further comprises the step of etching the exposed portions of said polish-stop layer with an etchant after said second layer has been patterned exposed and developed.

9. The method of claim 8 wherein a plurality of portions of said first layer are left exposed after said etching of said exposed portions of said polish-stop layer, and wherein said step (d) further comprises the step of plasma etching the exposed portions of said first layer after the exposed portions of said polish-stop layer have been removed.

10. The method of claim 6 further comprising the step of removing said polish-stop layer after step (g) has been performed.

11. The method of claim 6 wherein the step (g) of polishing comprises the step of chemical-mechanical polishing.

12. The method of claim 11 wherein said polish-stop layer comprises a material which oxidizes during chemical-mechanical polishing.

13. The method of claim 6 wherein the step (e) of depositing material comprises plating conductive material within the apertures.

14. The method of claim 6 wherein said third material has a resistance to polishing which is less than the resistance of the material of said polish-stop layer.

15. A method of forming planarized structures on a surface of a substrate comprising the steps of:

(a) forming a first layer of a first material over the substrate surface;

(b) forming apertures in said first layer;

(c) depositing material within said apertures to form a plurality of first structures located where the planarized structures are to be located;

(d) removing said first layer;

(e) forming a second layer of a second material over the substrate surface and the first structures such that the top surface of said second layer has high areas over said first structures, low areas between said first structures, and transition areas between said high and low areas, said low areas being below the tops of said first structures;

(f) forming a third layer of a third material over said second layer, said third material having a resistance to polishing which is greater than the resistance of said second material; and (g) thereafter polishing the resulting surface such that portions of said second layer and said first structures extending above said low areas are removed, said steps (d)–(g) thereby forming the planarized structures from said first structures.

16. The method of claim 15 wherein the step (f) of forming said third layer comprises the step of forming an aperture over at least one high area of said second layer and around the corresponding structure underlying said high area.

17. The method of claim 16 wherein the high area underlying said aperture is surrounded by a transition area, and wherein said aperture extends over a portion of said surrounding transition area.

18. The method of claim 15 wherein the step of polishing comprises the step of chemical-mechanical polishing.

19. The method of claim 18 wherein said third layer comprises a material which oxidizes during chemical-mechanical polishing.

20. The method of claim 15 wherein the step (c) of depositing material comprises plating conductive material within the apertures.

21. A method of forming one or more planarized structures on a surface of a substrate, said method comprising the steps of:

(a) forming a first layer of a first material over the surface of the substrate;

(b) forming a polish-stop layer over said first layer, said polish-stop layer comprising a material which oxidizes during chemical-mechanical polishing;

(c) forming a second layer over said polish-stop layer;

(d) forming a first set of one or more apertures through the composite layer formed by said first, second, and polish-stop layers;

(e) depositing a third material within said apertures to form one or more structures in said apertures;

(f) removing said second layer; and (g) thereafter polishing the resulting exposed surface such that the material of said polish-stop layer oxidizes during said polishing step.

22. A method of forming one or more planarized structures on a surface of a substrate, said method comprising the steps of:

(a) forming a first layer of a first material over the surface of the substrate;
(b) forming a polish-stop layer over said first layer;
(c) forming a second layer over said polish-stop layer, said second layer comprising a photosensitive material;
(d) forming a first set of one or more apertures through the composite layer formed by said first, second, and polish-stop layers, said step comprising the step of pattern exposing said second layer to actinic radiation and thereafter developing;
(e) depositing a third material within said apertures to form one or more structures in said apertures;
(f) removing said second layer; and
(g) thereafter polishing the resulting exposed surface.

* * * * *